United States Patent
Murabe et al.

(10) Patent No.: US 8,309,471 B2
(45) Date of Patent: Nov. 13, 2012

(54) METHOD OF MANUFACTURING SEMICONDUCTOR DEVICE

(75) Inventors: Yusaku Murabe, Kanagawa (JP); Fumihiro Bekku, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 130 days.

(21) Appl. No.: 12/923,072

(22) Filed: Aug. 31, 2010

(65) Prior Publication Data
US 2011/0053364 A1    Mar. 3, 2011

(30) Foreign Application Priority Data
Sep. 1, 2009  (JP) ................. 2009-201882

(51) Int. Cl.
  H01L 21/461  (2006.01)
  H01L 21/302  (2006.01)
  H01L 21/311  (2006.01)
(52) U.S. Cl. .......... 438/745; 438/747; 438/694

(58) Field of Classification Search .......... 438/694, 438/745, 747
See application file for complete search history.

(56) References Cited

U.S. PATENT DOCUMENTS

| | | | |
|---|---|---|---|
| 6,277,669 B1 * | 8/2001 | Kung et al. | 438/106 |
| 6,433,427 B1 * | 8/2002 | Wu et al. | 257/737 |
| 6,897,568 B2 * | 5/2005 | Haimerl et al. | 257/779 |
| 6,962,630 B2 | 11/2005 | Suzuki et al. | |
| 7,235,141 B2 * | 6/2007 | Suzuki et al. | 134/34 |
| 2003/0098046 A1 | 5/2003 | Suzuki et al. | |

FOREIGN PATENT DOCUMENTS
JP   2003-151949 A    5/2003
JP   2005-281720 A    10/2005
* cited by examiner Primary Examiner — Luan C Thai
(74) Attorney, Agent, or Firm — McGinn IP Law Group, PLLC

(57) ABSTRACT

A layer to be etched is first formed in a substrate. Then, a mask pattern is formed over the layer to be etched. Then, the layer to be etched is wet-etched using the mask pattern as a mask. In the procedure of performing wet etching, the substrate is dipped into an etching bath with the mask pattern downward.

12 Claims, 10 Drawing Sheets

METHOD OF MANUFACTURING SEMICONDUCTOR DEVICE

The application is based on Japanese patent application No. 2009-201882, the content of which is incorporated hereinto by reference.

BACKGROUND

1. Technical Field

The present invention relates to a method of manufacturing a semiconductor device which has a procedure of selectively removing a film to be etched by wet etching.

2. Related Art

In a semiconductor device, a terminal for external connection, such as a bump, is formed in order to mount the semiconductor device at the surface of a mounting board. In recent years, the terminal for external connection has been formed by forming a core with resin and selectively forming a conductive film over the core. Wet etching is used in the procedure of selectively forming the conductive film over the core.

Moreover, Japanese Unexamined patent publication No. 2003-151949 discloses that the top surface of a wafer faces downward in a chemical processing apparatus used in a lift-off method. An object of the technique described in Japanese Unexamined patent publication No. 2003-151949 is to prevent a metal located at a surface of a resist from coming in contact with an interconnect pattern when the resist is lifted off. That is, if the top surface of a wafer faces downward in lift-off, an unnecessary metal which began to be lifted off from the wafer hangs downward due to its own weight. Accordingly, the unnecessary metal is prevented from coming in contact with an interconnect pattern.

In addition, Japanese Unexamined patent publication No. 2005-281720 discloses that a plating solution is circulated by collecting the plating solution from the bottom surface of a plating bath and then supplying it from the upper side of the plating bath in an electrolytic plating processing apparatus.

In wet etching, the concentration of etchant may not be uniform at the surface to be etched which is formed with a layer to be etched. In this case, the etching rate may not be uniform at the surface to be etched. The inventor has found out that one of the causes is a reaction product generated at the time of etching. That is, although a reaction product is generated at a layer to be etched, the reaction product drifts near the surface to be etched after being generated. Accordingly, the reaction product inhibits the etchant, which has not reacted yet, from approaching the surface to be etched. For this reason, it is desirable to make the reaction product, which is generated at the time of etching, move quickly away from the surface to be etched.

SUMMARY

In one embodiment, there is provided a method of manufacturing a semiconductor device including: forming a layer to be etched in a substrate; forming a mask pattern over the layer to be etched; and performing wet etching of the layer to be etched using the mask pattern as a mask. In the step of performing wet etching, the substrate is dipped into an etching bath in a state where the mask pattern faces downward.

According to the present invention, the mask pattern of the substrate faces downward in the etching bath. For this reason, gravity pulls on a reaction product, which is generated at the time of etching, in a direction away from the surface to be etched which is formed with the layer to be etched. Accordingly, it is possible to make the reaction product move quickly away from the surface to be etched.

According to the present invention, a reaction product, which is generated at the time of etching, can be made to move quickly away from the surface to be etched which is formed with the layer to be etched.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
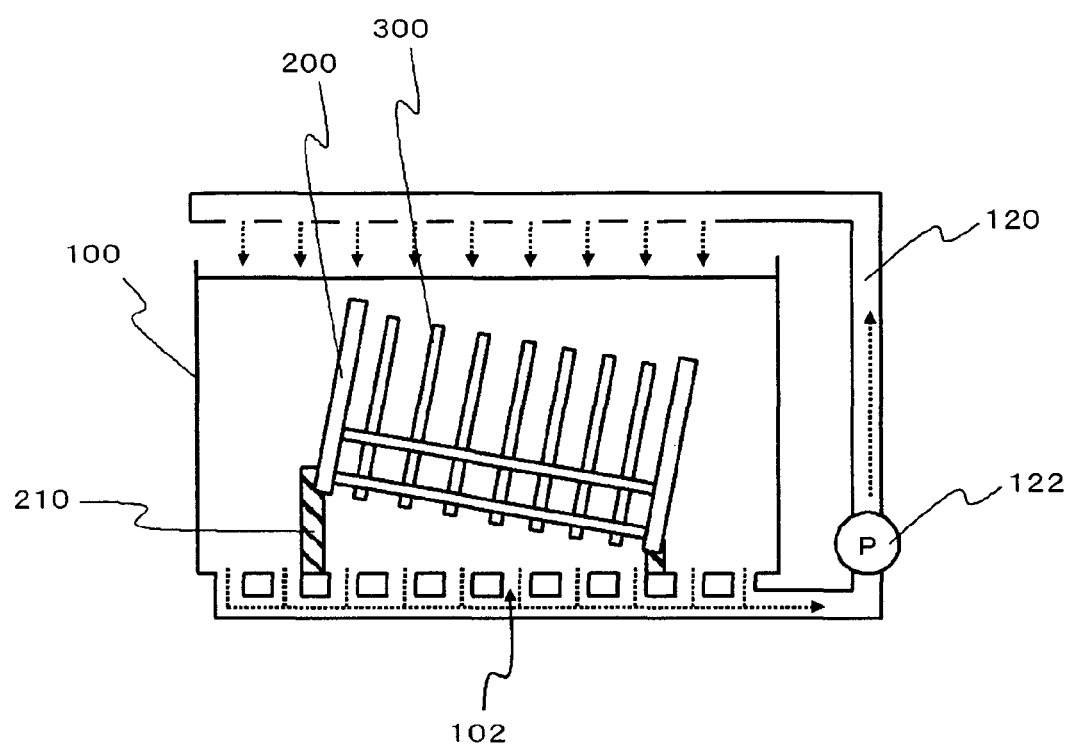
FIG. 1 is a view showing the configuration of an etching system used in a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In addition, the same components are denoted by the same reference numerals in all drawings, and the explanation will not be repeated.

First Embodiment

A method of manufacturing a semiconductor device according to a first embodiment has the following procedures. First, a layer to be etched is formed in a substrate 300. Then, a mask pattern is formed over the layer to be etched. Then, the layer to be etched is wet-etched using the mask pattern as a mask. In the procedure of performing wet etching, the substrate 300 is dipped into an etching bath 100 with the mask pattern downward. Now, a detailed explanation thereof will be given.

FIG. 1 is a view showing the configuration of an etching system used in the first embodiment. This etching system has the etching bath 100, a circulation path 120 of etching solution, a substrate holder 200, and a holder supporting member 210.

The etching bath 100 holds an etching solution. The circulation path 120 collects the etching solution, which is contained in the etching bath 100, through an outlet 102 provided at a bottom surface of the etching bath 100, and supplies the etching solution to the etching bath 100 again from the upper side of the etching bath 100. In order to make the etching solution circulate, a pump 122 is provided at the circulation path 120. In addition, impurities lighter than the etching solution float on the liquid surface of the etching bath 100. The impurities overflow from the liquid surface of the etching bath 100 and move through a path (not shown) which joins the etching solution collected through the outlet 102. Then, the impurities are collected by a filter (not shown), which is provided before the pump 122, together with impurities which are included in the etching solution collected through the outlet 102 and are heavier than the etching solution. Thus, the etching solution is filtered by a filter and passes through the pump 122 and the circulation path 120.

The substrate holder 200 holds the plurality of substrates 300 aligned in parallel to each other. The substrate holder 200 holds the substrate 300 in a vertical state. The plurality of substrates 300 is wet-etched simultaneously by dipping the substrate holder 200 into the etching solution contained in the etching bath 100.

The holder supporting member 210 holds a lower portion of the substrate holder 200 when dipping the substrate holder 200 into the etching bath 100. The holder supporting member 210 holds the substrate holder 200 in a state where the substrate holder 200 is inclined with the top surface side of the substrate 300 downward. Accordingly, in a state where the substrate 300 has been dipped into the etching bath 100, the layer to be etched and the mask pattern formed in the substrate 300 face downward. In addition, the etching solution contained in the etching bath 100 flows downward from the top. Therefore, the etching solution flows between the substrates 300. Moreover, in the first embodiment, the top surface of the substrate 300 means a surface, which has a layer to be etched, of two main surfaces of the substrate 300. In addition, the bottom surface of the substrate 300 means a surface opposite to the top surface of the two main surfaces of the substrate 300.

Next, the method of manufacturing a semiconductor device according to the first embodiment will be described with reference to FIGS. 2A, 2B and 3. This method of manufacturing a semiconductor device is a method of forming a bump using a bump core made of resin.

Figure 2A:
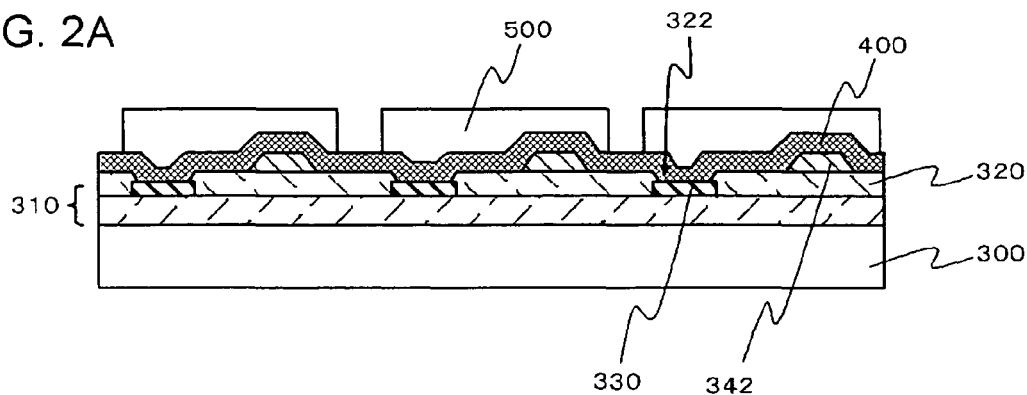
FIGS. 2A and 2B are sectional views illustrating a method of manufacturing a semiconductor device according to the first embodiment.
Figure 2B:
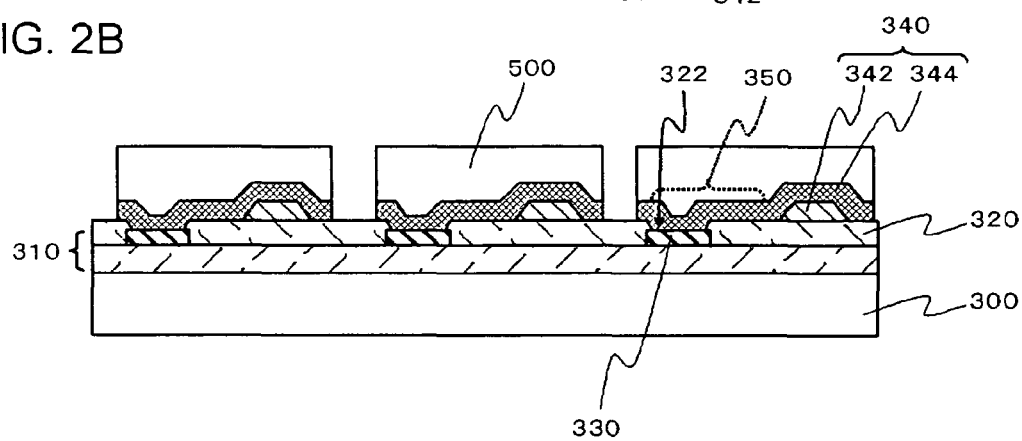

First, as shown in FIG. 2A, a multilayered interconnect layer 310 is formed over a first main surface (surface to be etched) of the substrate 300. The substrate 300 is a silicon wafer, for example. An electrode pad 330 is formed in an uppermost interconnect layer of the multilayered interconnect layer 310. Then, a protective insulation film 320 is formed over the multilayered interconnect layer 310. Then, an opening 322 located over the pad 330 is formed in the protective insulation film 320 by selectively removing the protective insulation film 320.

Then, an insulating resin layer is formed over the protective insulation film 320, and this insulating resin layer is selectively removed. As a result, a plurality of bump cores 342 is formed over the protective insulation film 320.

Then, a conductive film 400 is formed over the electrode pad 330, the protective insulation film 320, and the bump core 342. The conductive film 400 is an Au film, for example. Then, a resist film is formed over the conductive film 400, and this resist film is exposed and developed. As a result, a resist pattern 500 is formed over the conductive film 400.

Then, the substrate 300 in the state shown in FIG. 2A is etched using the etching system shown in FIG. 1. As an etching solution, for example, a $KI_3$ aqueous solution is used. In this case, a portion of the conductive film 400 which is not covered by the resist pattern 500 is removed, as shown in FIG. 2B. As a result, a bump 340 and an interconnect 350 are formed. The bump 340 is formed by a conductive film 344 and the bump core 342. The interconnect 350 serves to connect the bump 340 with the electrode pad 330.

Figure 3:
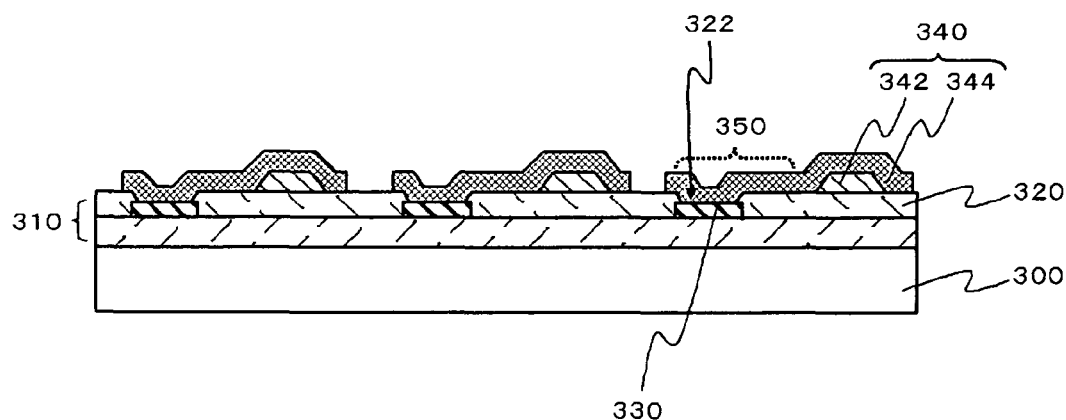
FIG. 3 is a sectional view illustrating the method of manufacturing a semiconductor device according to the first embodiment.

Then, as shown in FIG. 3, the resist layer 500 is removed.

Figure 4:
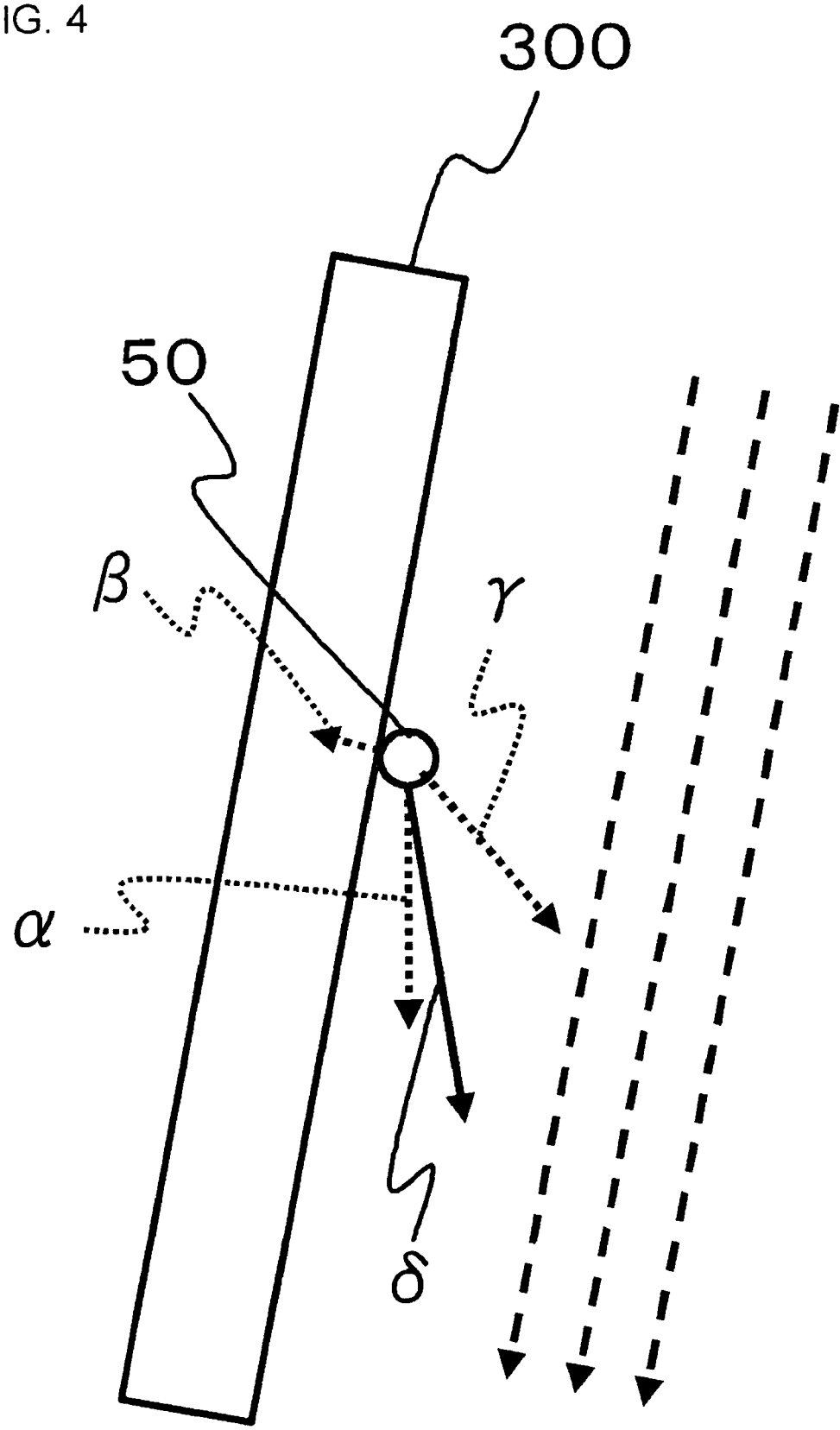
FIG. 4 is a view for explaining the effects when a surface side of a substrate faces downward in an etching bath.

FIG. 4 is a view for explaining the effects when the top surface side of the substrate 300 faces downward in the etching bath 100. After the conductive film 400 is etched in the etching bath 100, a reaction product 50 is generated near the top surface of the substrate 300. A resultant force $\delta$ of gravity $\alpha$, adsorption force $\beta$ determined by the balance of intermolecular interaction and electrostatic interaction caused between the substrate 300 and the reaction product 50, and a force $\gamma$ sucked into the flow of the etching solution is applied to the reaction product 50. Since the top surface side of the substrate 300 faces downward, gravity $\alpha$ acts in a direction away from the substrate 300. For this reason, the resultant force $\delta$ applied to the reaction product 50 acts in the direction away from the substrate 300. Accordingly, the reaction product 50 moves away from the top surface of the substrate 300 quickly.

Figure 5:
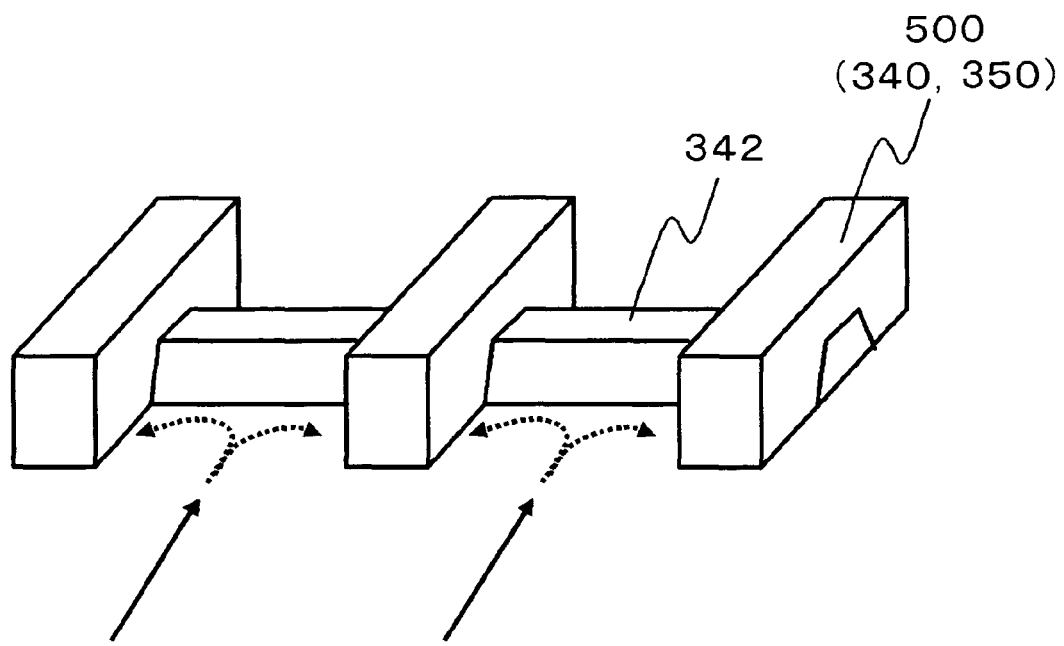
FIG. 5 is a schematic view for explaining the flow of an etching solution when etching a substrate in a state shown in FIG. 2A using the etching system shown in FIG. 1.

FIG. 5 is a schematic view for explaining the flow of the etching solution when performing wet etching of the substrate 300 in the state shown in FIG. 2A. The bump core 342 in the state shown in FIG. 2A extends long in a direction perpendicular to the section shown in FIG. 2A. Moreover, as shown in FIG. 3, the plurality of bumps 340 and the plurality of interconnects 350 are formed by one bump core 342 using a part of one bump core 342.

One resist pattern 500 is formed for one bump 340 and one interconnect 350. As described above, the plurality of bumps 340 and the plurality of interconnects 350 are formed by one bump core 342. Accordingly, the plurality of resist patterns 500 is provided at distances therebetween so as to cross one bump core 342.

Moreover, the etching solution flows between the resist patterns 500 in a state rectified by the resist patterns 500, as indicated by a solid arrow in the drawing. However, a portion of the bump core 342, which is not covered by the resist pattern 500, is located between the resist patterns 500. Accordingly, a part of the etching solution, which has flowed between the resist patterns 500, flows toward the side surface of the resist pattern 500 by the bump core 342, as indicated by a dotted line in the drawing. For this reason, if the flow of the etching solution at the top surface of the substrate 300 is fast, new etching solution is easily supplied around the resist pattern 500. As a result, the amount of side etching of a region, which is covered by the resist pattern 500, of the conductive film 400 which is a layer to be etched increases. In addition, if the processing time increases, not only the conductive film 400 but also the resist pattern 500 deteriorates from the side surface. As a result, the function of the resist pattern 500 as a mask deteriorates.

On the other hand, in the etching system shown in FIG. 1, etching solution flows downward from the top in the etching bath 100. Moreover, in the etching bath 100, the top surface side of the substrate 300 faces downward. For this reason, the etching solution which has flowed downward from the top is rectified by the bottom surface side of the substrate 300, and flows along the bottom surface of the substrate 300. Accordingly, the etching solution, which flows between the substrates 300, flows fast at the bottom surface side of the substrate 300 and flows slowly at the top surface side of the substrate 300. As a result, an increase in the amount of side etching and deterioration of the resist pattern 500 are suppressed. Moreover, the difference in flow rates increases the force γ sucked into the flow of the etching solution in FIG. 4, so that the reaction product 50 moves away from the top surface of the substrate 300 more quickly and more reliably.

According to the first embodiment described until now, the top surface side of the substrate 300 faces downward in the etching bath 100. For this reason, gravity α applied to the reaction product 50 acts in a direction away from the substrate 300. Accordingly, the resultant force δ applied to the reaction product 50 acts in the direction away from the substrate 300. As a result, the reaction product 50 moves away from the substrate 300 quickly.

Second Embodiment

Figure 6:
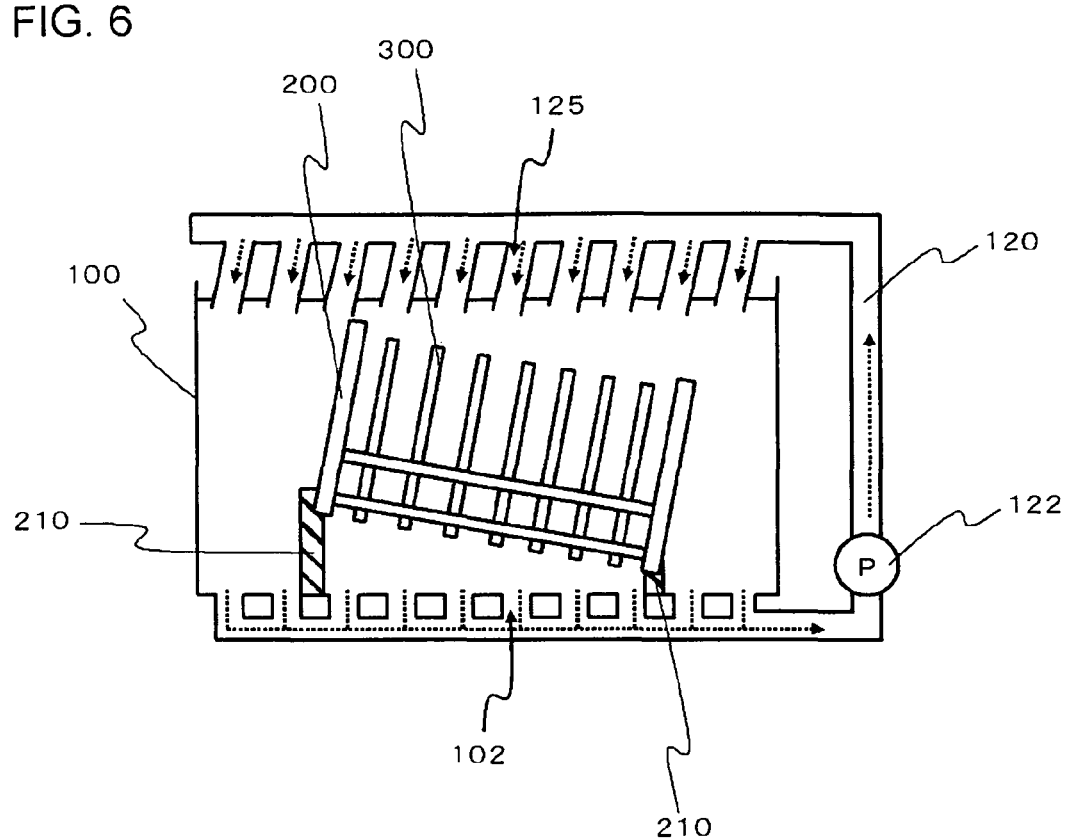
FIG. 6 is a view showing the configuration of an etching system according to a second embodiment.

FIG. 6 is a view showing the configuration of an etching system according to a second embodiment. This etching system has the same configuration as the etching system used in the first embodiment except for a supply pipe 125 for supplying etching solution from the circulation path 120 to the etching bath 100. A tip of the supply pipe 125 is put in the etching solution contained in the etching bath 100. In addition, the extension direction of the supply pipe 125 is parallel to the substrate 300 in the etching bath 100. A method of manufacturing a semiconductor device using this etching system is the same as that in the first embodiment.

Also in the second embodiment, the resultant force δ applied to the reaction product 50 acts in the direction away from the substrate 300, similar to the first embodiment. Accordingly, the reaction product 50 moves away from the substrate 300 quickly. In addition, since the extension direction of the supply pipe 125 is parallel to the substrate 300 in the etching bath 100, the flow of etching solution supplied from the supply pipe 125 is also parallel to the substrate 300. For this reason, the flow rate of the etching solution flowing between the substrates 300 increases. In this case, the force γ, which is sucked into the flow of the etching solution, among the forces applied to the reaction product 50 shown in FIG. 4 increases compared with that in the first embodiment. Accordingly, the reaction product 50 moves away from the top surface of the substrate 300 more quickly.

Third Embodiment

Figure 7:
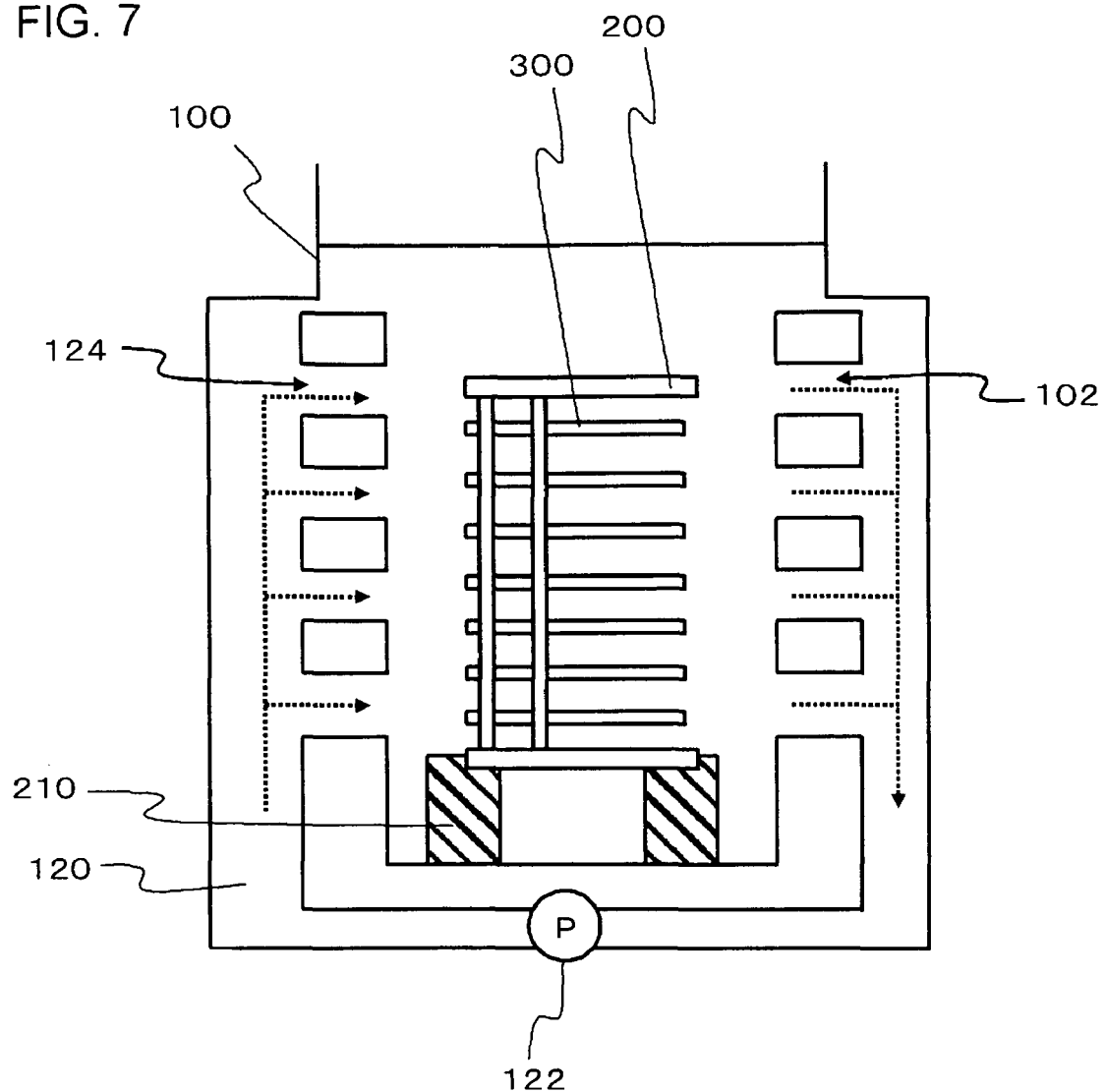
FIG. 7 is a view showing the configuration of an etching system according to a third embodiment.

FIG. 7 is a view showing the configuration of an etching system according to a third embodiment. In this etching system, the outlet 102 is provided at the side surface of the etching bath 100, and an inlet 124 for returning the etching solution is provided in a region, which is opposite the outlet 102, of the side surface of the etching bath 100. In addition, the substrate holder 200 in the etching bath 100 is supported by the holder supporting member 210 such that the substrate 300 is level and the top surface faces downward. A method of manufacturing a semiconductor device using this etching system is the same as that in the second embodiment.

In the third embodiment, the etching solution in the etching bath 100 flows sideways. Since the substrate 300 is horizontally disposed as described above, the etching solution flows between the substrates 300.

Also in the third embodiment, the resultant force δ applied to the reaction product 50 acts in the direction away from the substrate 300, similar to the first embodiment. Accordingly, the reaction product 50 moves away from the top surface of the substrate 300 quickly.

Fourth Embodiment

Figure 8:
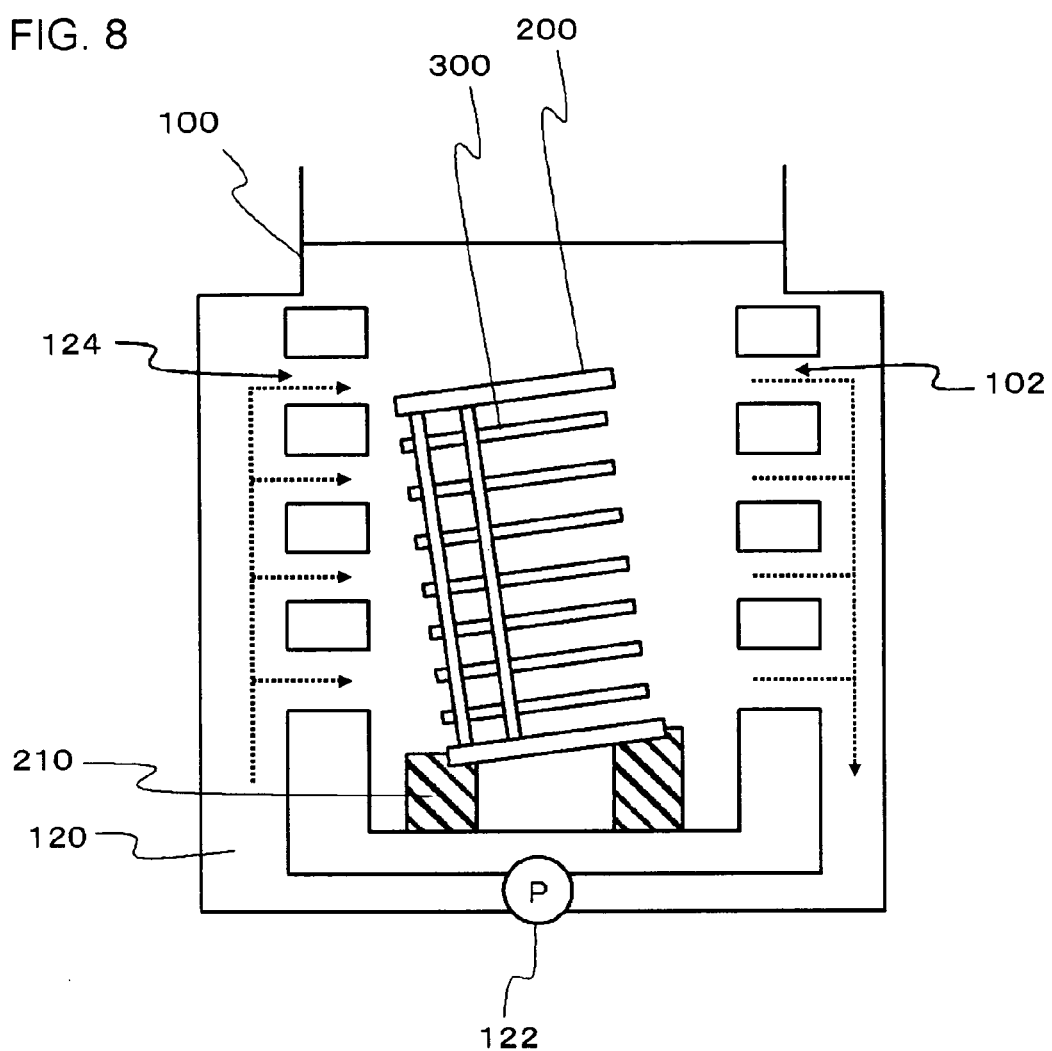
FIG. 8 is a view showing the configuration of an etching system according to a fourth embodiment.

FIG. 8 is a view showing the configuration of an etching system according to a fourth embodiment. This etching system has the same configuration as the etching system according to the third embodiment except that the substrate holder 200 is supported by the holder supporting member 210 in the etching bath 100 such that the substrate 300 is inclined. A method of manufacturing a semiconductor device using this etching system is the same as that in the first embodiment.

The substrate 300 is inclined such that the upstream side in the flow of the etching solution is located lower than the downstream side. For this reason, the etching solution is rectified by the bottom surface side of the substrate 300, and flows along the bottom surface of the substrate 300. Accordingly, the etching solution, which flows between the substrates 300, flows fast at the bottom surface side of the substrate 300 and flows slowly at the top surface side of the substrate 300.

Also in the fourth embodiment, the same effects as in the first embodiment can be achieved.

Fifth Embodiment

Figure 9:
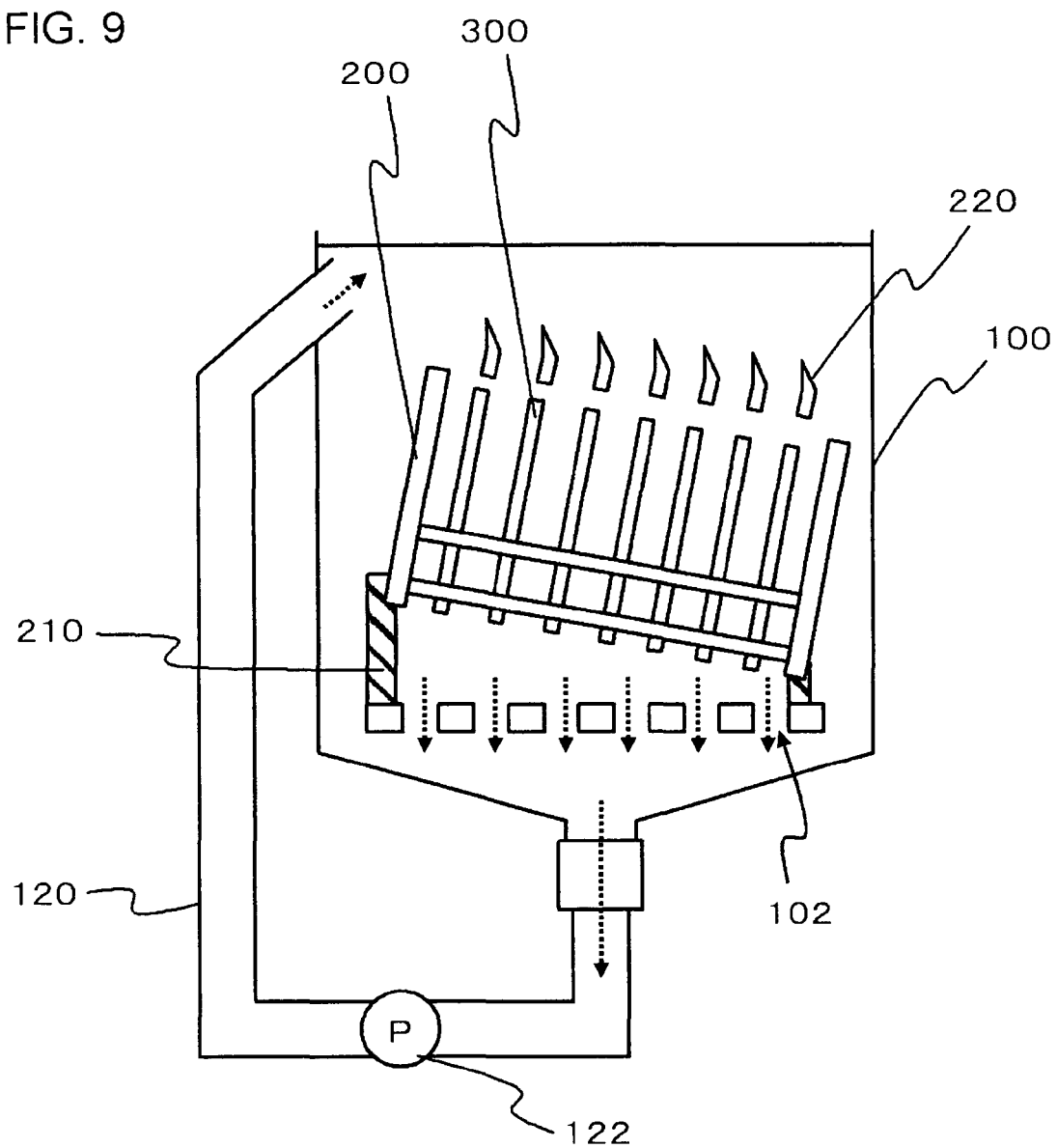
FIG. 9 is a view showing the configuration of an etching system according to a fifth embodiment.

FIG. 9 is a view showing the configuration of an etching system according to a fifth embodiment. This etching system has the same configuration as the etching system used in the first embodiment except for the following points.

First, through the circulation path 120 of the etching solution, the etching solution is supplied to the etching bath 100 from an upper portion of a region, which faces the bottom surface of the substrate 300, of the side surface of the etching bath 100. Then, in the etching bath 100, the etching solution is supplied from the upper portion of the side surface of the etching bath 100 and then flows toward the lower portion of the etching bath 100.

In addition, a rectifying plate 220 is provided in the etching bath 100. The rectifying plate 220 is disposed above each substrate 300 so that the etching solution flows between the substrates 300.

Moreover, the top surface side of the substrate 300 faces downward in the etching bath 100. For this reason, the resultant force δ applied to the reaction product 50 acts in the direction away from the substrate 300, similar to the first embodiment. Accordingly, the reaction product 50 moves away from the top surface of the substrate 300 quickly.

Figure 10:
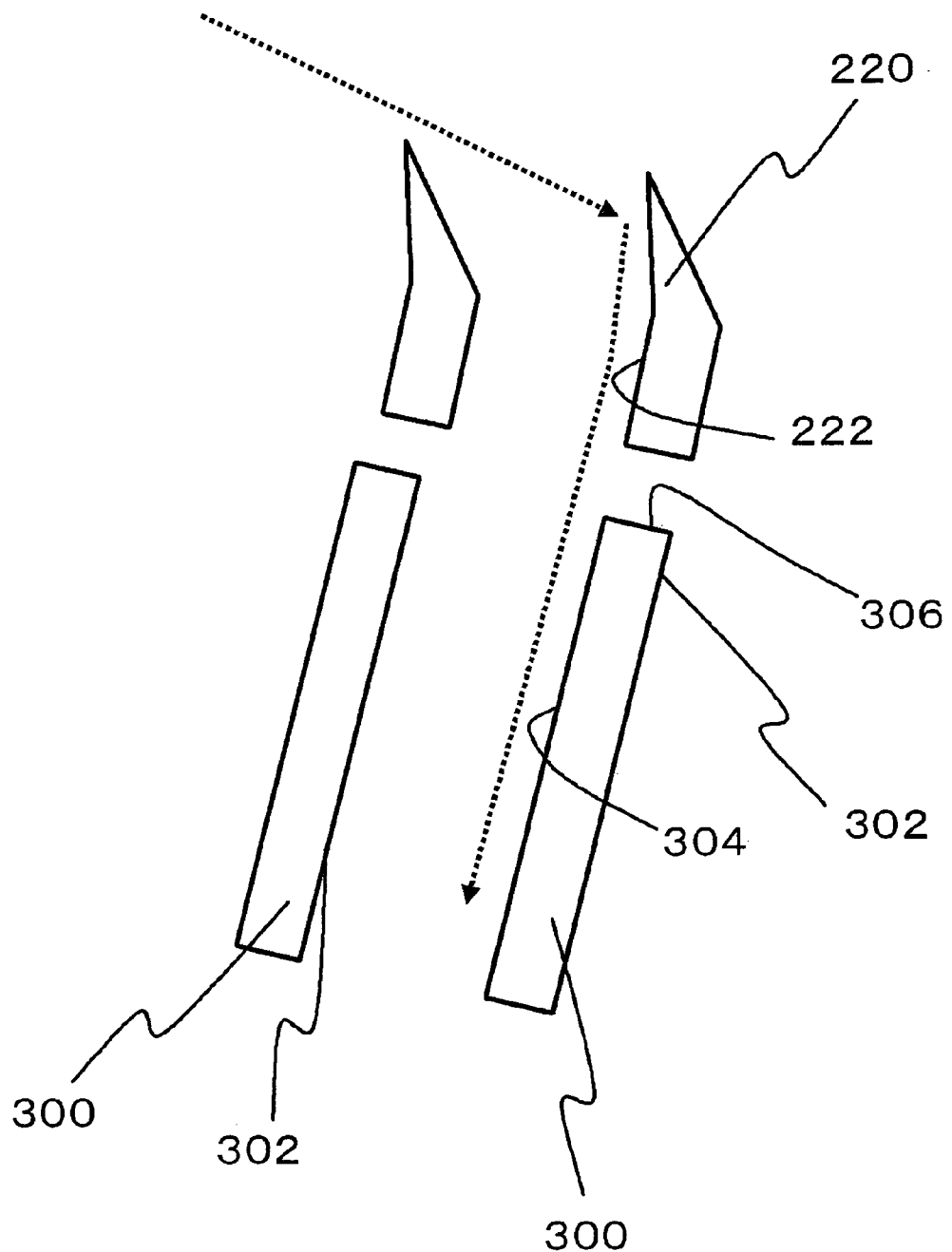
FIG. 10 is an enlarged view of main parts shown in FIG. 9.

FIG. 10 is an enlarged view of the main parts in FIG. 9. As described above, in the etching bath 100, the etching solution is supplied from the upper portion of the region, which faces the bottom surface of the substrate 300, of the side surface. Accordingly, the flow of the etching solution around the rectifying plate 220 has a component in the horizontal direction. This horizontal component flows in a direction from the bottom surface of the substrate 300 toward the top surface. Accordingly, in the flow of the etching solution around the rectifying plate 220, a component parallel to an end surface 306 of the substrate 300 flows from a bottom surface 304 of the substrate 300 toward a top surface 302.

Moreover, when seen from the direction parallel to the bottom surface 304 of the substrate 300, an end, which faces the substrate 300, of a surface 222 of the rectifying plate 220 facing the upstream side in the flow of the etching solution is approximately flush with the bottom surface 304 of the substrate 300 or overlaps the end surface 306 of the substrate 300. For this reason, the etching solution comes in contact with the surface 222 of the rectifying plate 220, is rectified in the direction parallel to the bottom surface 304 of the substrate 300, and then flows along the bottom surface 304 of the substrate 300. Accordingly, the etching solution, which flows between the substrates 300, flows fast at the bottom surface 304 side of the substrate 300 and flows slowly at the top surface 302 side of the substrate 300. As a result, an increase in the amount of side etching and deterioration of the resist pattern 500 described with reference to FIG. 5 are suppressed. Moreover, the difference of flow rates increases the force γ sucked into the flow of the etching solution in FIG. 4, so that the reaction product 50 moves away from the top surface of the substrate 300 more quickly and more reliably.

Figure 11:
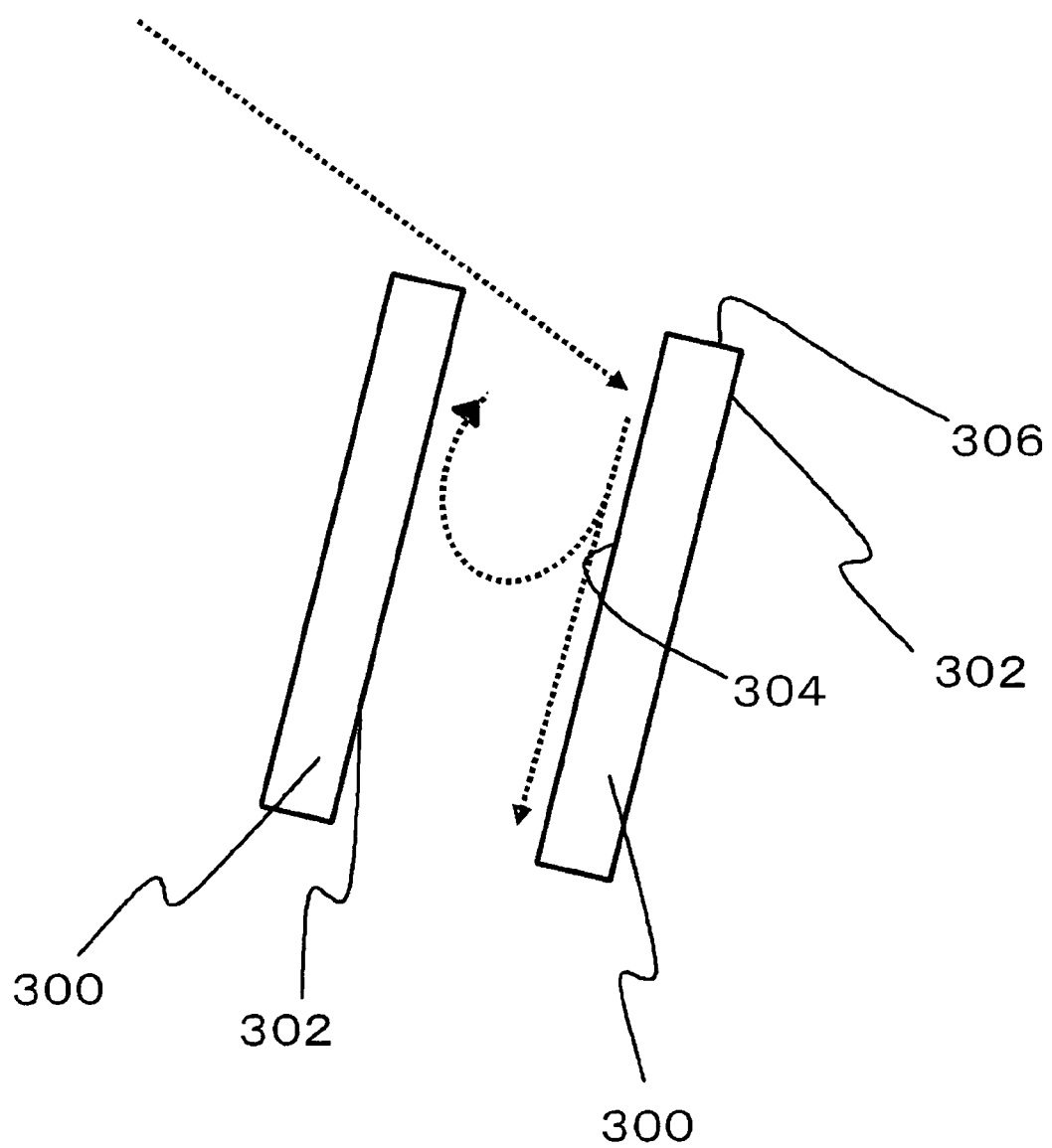
FIG. 11 is a view for explaining a problem when a rectifying plate is not used.

When the rectifying plate 220 is not used, the etching solution is rectified by the bottom surface 304 of the substrate 300 as shown in FIG. 11. In this case, some of the etching solution forms an eddy in a region between the substrates 300. The etching rate in a portion, which corresponds to the eddy, of the top surface 302 of the substrate 300 is higher than that in the other portions. Such a problem can be suppressed by using the rectifying plate 220.

While the first to fifth embodiments of the present invention have been described with reference to the drawings, these are only an illustration of the present invention, and various other configurations may also be adopted.

It is apparent that the present invention is not limited to the above embodiments, but may be modified and changed without departing from the scope and spirit of the invention.

What is claimed is:

1. A method of manufacturing a semiconductor device, the method comprising:
    forming a layer to be etched in a substrate;
    forming a mask pattern over said layer to be etched; and
    performing a wet etching of said layer to be etched using said mask pattern as a mask,
    wherein, in said performing said wet etching, said substrate is dipped into an etching bath in a state where said mask pattern faces downward, and
    wherein said forming said layer to be etched comprises forming a conductive film as said layer.

2. The method according to claim 1, further comprising, before said forming said layer to be etched:
    forming an electrode pad in said substrate;
    forming a protective insulation film, which comprises an opening located over said electrode pad, over and around said electrode pad; and
    forming a bump core selectively over said protective insulation film,
    wherein said forming said layer to be etched comprises forming the conductive film over said bump core, said protective insulation film, and said electrode pad, and
    wherein said forming of said bump comprises forming a bump, which is formed by said conductive film and said bump core, and an interconnect, which connects said electrode pad and said bump to each other, are formed by selectively removing said conductive film in said performing said wet etching of said layer to be etched.

3. The method according to claim 1, wherein said substrate comprises a top surface formed with a layer to be etched, which is a first main surface, and a bottom surface which is a second main surface and is an opposite surface of said top surface,
    wherein, in said performing said wet etching, a plurality of said substrates is dipped into said etching bath in a state aligned in parallel to each other, and
    wherein a rectifying plate is provided in said etching bath so that an etching solution flows between said substrates.

4. The method according to claim 3, wherein in said performing said wet etching, a component parallel to an end surface of said substrate flows from a bottom surface of said substrate toward a top surface in a flow of said etching solution around said rectifying plate, and
    wherein, when seen from a direction parallel to said bottom surface of said substrate, an end, which faces said substrate, of a surface of said rectifying plate facing an upstream side in the flow of said etching solution is approximately flush with said bottom surface of said substrate or overlaps an end surface of said substrate.

5. The method according to claim 3, wherein between said substrates, a flow of said etching solution at a bottom surface side of said substrate is faster than a flow of said etching solution at a top surface side of said substrate.

6. A method of manufacturing a semiconductor device, the method comprising:
    forming a resist film over a plurality of substrates;
    holding the plurality of substrates aligned in parallel to each other in a vertical state;
    facing a top surface side of each of the plurality of substrates downward in an etching bath; and
    etching the plurality of substrates in the etching bath.

7. The method according to claim 6, wherein the etching the plurality of substrates comprises causing an etching solution of the etching bath to flow downwards from a top of the etching bath, and
    wherein the etching solution flows between each of the plurality of substrates.

8. The method according to claim 7, wherein the etching the plurality of substrates further comprises collecting the etching solution through an outlet provided at a bottom surface of the etching bath; and
    supplying the etching solution to the etching bath again from an upper side of the etching bath.

9. The method according to claim 8, wherein an impurity from a reaction of the etching solution on the plurality of substrates become lighter than the etching solution and floats on a liquid surface of the etching bath, and
    wherein the impurity overflows from a liquid surface of the etching bath joins the etching solution collected through an outlet.

10. The method according to claim 6, further comprising:
    forming an electrode pad, protective insulation film, and a bump core on the substrate, before said forming said resist film over said plurality of substrates; and
    forming a conductive film over the electrode pad, the protective insulation film, and the bump core.

11. The method according to claim 10, wherein the conductive film comprises a gold film.

12. The method according to claim 10, wherein the forming the resist film over the plurality of substrates further comprises forming the resist film over the conductive film, and
    wherein the etching the plurality of substrates comprises etching the conductive film in the etching bath, except where the conductive film is covered by the resist film.

* * * * *